United States Patent
Gutman (10) Patent No.: US 10,237,873 B2
(45) Date of Patent: *Mar. 19, 2019

(54) SYSTEMS AND METHODS FOR SIMULTANEOUS SAMPLING OF SERIAL DIGITAL DATA STREAMS FROM MULTIPLE ANALOG-TO-DIGITAL CONVERTERS (ADCS), INCLUDING IN DISTRIBUTED ANTENNA SYSTEMS

(71) Applicant: Corning Optical Communications Wireless Ltd, Airport (IL)

(72) Inventor: Amit Gutman, Tel Aviv (IL)

(73) Assignee: Corning Optical Communications Wireless Ltd, Airport City (IL)

( * ) Notice: Subject to any disclaimer, the term of this patent is extended or adjusted under 35 U.S.C. 154(b) by 0 days.

This patent is subject to a terminal disclaimer.

(21) Appl. No.: 15/793,507

(22) Filed: Oct. 25, 2017

(65) Prior Publication Data

US 2018/0049183 A1 Feb. 15, 2018

Related U.S. Application Data

(63) Continuation of application No. 15/142,733, filed on Apr. 29, 2016, now Pat. No. 9,807,772, which is a
(Continued)

(51) Int. Cl.
*H04W 72/04* (2009.01)
*H03M 1/12* (2006.01)
*H04W 88/08* (2009.01)

(52) U.S. Cl.
CPC ......... *H04W 72/048* (2013.01); *H03M 1/123* (2013.01); *H03M 1/1245* (2013.01); *H04W 72/0446* (2013.01); *H04W 88/085* (2013.01)

(58) Field of Classification Search
CPC ......... H04B 10/25758; H04B 10/2507; H04B 10/25753; H04B 10/07955;
(Continued)

(56) References Cited

U.S. PATENT DOCUMENTS 5,099,239 A * 3/1992 Bruce ................. H01L 27/0805
257/E27.048
5,585,802 A * 12/1996 Cabler ................. G10H 1/0066
341/143
(Continued)

FOREIGN PATENT DOCUMENTS

JP 2010141386 A 6/2010
WO 2011124717 A1 10/2011
WO 2014014974 A1 1/2014

OTHER PUBLICATIONS

International Search Report and Written Opinion PCT/IL15/050548 dated Oct. 28, 2015.

*Primary Examiner* — Jung Liu
(74) *Attorney, Agent, or Firm* — C. Keith Montgomery (57) ABSTRACT

Systems and methods for simultaneous sampling of serial digital data streams from multiple analog-to-digital converters (ADCs), including in distributed antenna systems, are disclosed. In one embodiment, a controller unit samples a plurality of serial digital data streams simultaneously. To allow the controller unit to sample the multiple serial digital data streams simultaneously from a plurality of ADCs, the controller unit is configured to provide a plurality of data input ports. Each of the ADCs is coupled to a common chip select port and clock signal port on the controller unit. The controller unit communicates a chip select signal on the chip select port to activate all of the ADCs simultaneously to cause each of the ADCs to provide its respective digital data stream to the respective data input port of the controller unit
(Continued)

simultaneously for sampling. As a result, fewer or lower-cost components may be used to sample multiple ADCs.

22 Claims, 9 Drawing Sheets

Related U.S. Application Data continuation of application No. 14/291,356, filed on May 30, 2014, now Pat. No. 9,357,551.

(58) Field of Classification Search
CPC ..... Y02B 60/1221; G06F 1/3237; G06F 1/32; G06F 13/10; H04L 5/0035; H04L 5/0055; H04L 5/0057; H04L 12/2869; H04L 12/5695; H04L 47/00; H04L 47/70; H04L 47/78; H04L 47/821; H04L 47/827; H04W 72/04

See application file for complete search history.

(56) References Cited

U.S. PATENT DOCUMENTS

| | | | |
|---|---|---|---|
| 7,848,747 B2 | 12/2010 | Wala | |
| 9,357,551 B2* | 5/2016 | Gutman | H04W 72/048 |
| 2004/0008136 A1* | 1/2004 | Reyneri | H03M 1/123 341/155 |
| 2005/0180314 A1* | 8/2005 | Webster | H04L 5/023 370/208 |
| 2007/0030185 A1* | 2/2007 | Bandy | H03M 9/00 341/101 |
| 2007/0061342 A1* | 3/2007 | Magdeburger | G06F 13/385 |
| 2010/0120386 A1* | 5/2010 | Konstantinos | H03H 17/06 455/180.1 |
| 2010/0156685 A1* | 6/2010 | Westwick | H03M 1/002 341/135 |
| 2012/0309337 A1* | 12/2012 | Zhu | H04L 7/0334 455/341 |
| 2013/0003714 A1* | 1/2013 | Cannon | H04L 27/0002 370/345 |
| 2014/0146861 A1 | 5/2014 | Li et al. | |
| 2014/0248050 A1* | 9/2014 | Crilly, Jr. | H04B 10/25753 398/38 |
| 2015/0055720 A1* | 2/2015 | Lin | G06F 13/128 375/259 |
| 2015/0056941 A1* | 2/2015 | Lin | H04B 1/18 455/352 |

* cited by examiner

SYSTEMS AND METHODS FOR SIMULTANEOUS SAMPLING OF SERIAL DIGITAL DATA STREAMS FROM MULTIPLE ANALOG-TO-DIGITAL CONVERTERS (ADCS), INCLUDING IN DISTRIBUTED ANTENNA SYSTEMS

PRIORITY APPLICATIONS

This application is a continuation of U.S. application Ser. No. 15/142,733 filed on Apr. 29, 2016 which is a continuation of U.S. application Ser. No. 14/291,356, filed on May 30, 2014, the content of each is relied upon and incorporated herein by reference in their entireties.

BACKGROUND

The disclosure relates generally to sampling analog-to-digital converters (ADCs), and more particularly to providing devices, systems, and methods, including in distributed antenna systems (DASs), to simultaneously sample ADCs.

An ADC converts an analog input signal into a digital output signal. The digital output signal is a digital representation or value of the analog input signal. For example, for an 8-bit ADC having a digital output signal range of 0-255 (i.e., 0xFF), an analog signal having an amplitude of the maximum range of the ADC would be converted to the digital value 255. This conversion takes a specific amount of time for the ADC to complete, depending on such factors as the method used by the ADC for the conversion, the desired level of precision, and the signal processing capabilities of the ADC. ADCs can be deployed in systems, including communications systems that carry analog communications signals, to convert analog signals to digital values for further processing and analysis in a digital domain.

Figure 1:
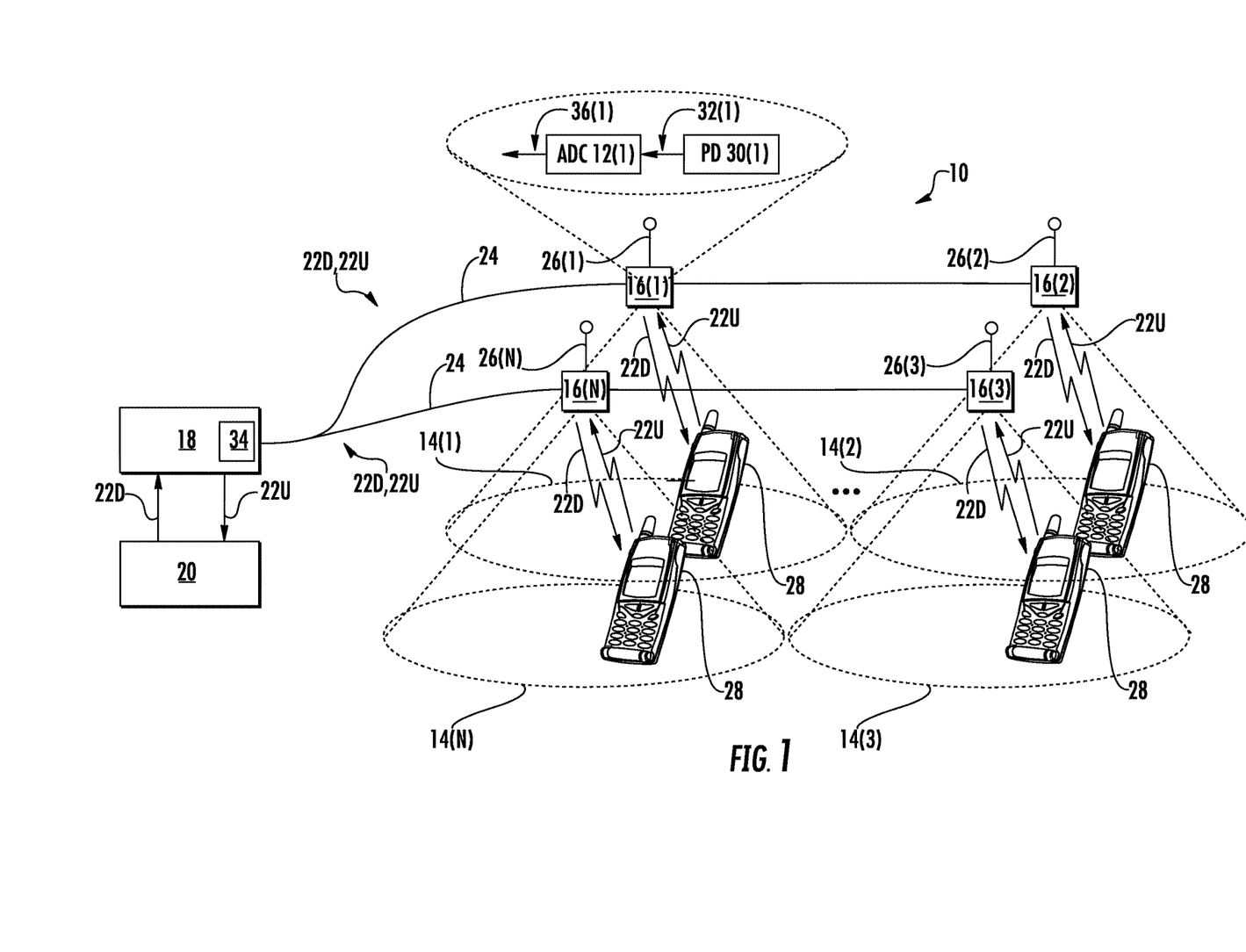
FIG. 1 is a schematic diagram of an exemplary distributed antenna system (DAS) capable of distributing radio frequency (RF) communications services to client devices, wherein the DAS may include multiple analog-to-digital converters (ADCs) that can convert analog data regarding communications signals to digital data.

A DAS is a type of communications system that may distribute analog communications signals. In a DAS, communications signals can be distributed from a central unit (which can also be referred to as a head-end unit) to one or more remote units forming remote coverage areas. ADCs may be provided in communications components in a DAS to sample distributed communications signals or to convert detected information about the distributed communications signals, such as radio frequency (RF) power, from an analog value to a digital value for analysis and processing. In this regard, FIG. 1 illustrates an exemplary DAS 10 that can include ADCs 12(1)-12(N) (only one ADC, 12(1) is shown) to convert analog signals distributed in the DAS 10 to digital values. The DAS 10 provides distribution of communications signals to provide communications services to coverage areas 14(1)-14(N) in the DAS 10, where N is the number of coverage areas. These communications services can include cellular services, such as a cellular service operating using the Long Term Evolution (LTE) cellular protocol, for example. The coverage areas 14(1)-14(N) may be remotely located. In this case, the remote coverage areas 14(1)-14(N) are created by and centered on remote antenna units 16(1)-16(N) coupled to a central unit 18 (e.g., a head-end controller or head-end unit). The central unit 18 may be communicatively coupled to a base station 20. In this regard, the central unit 18 receives analog downlink communications signals 22D from the base station 20 to be distributed to the remote antenna units 16(1)-16(N). The remote antenna units 16(1)-16(N) are configured to receive the downlink communications signals 22D from the central unit 18 over a communications medium 24 to be distributed to the respective coverage areas 14(1)-14(N) of the remote antenna units 16(1)-16(N). Each remote antenna unit 16(1)-16(N) may include one or more RF transmitters/receivers (not shown) and respective antennas 26(1)-26(N) operably coupled to the RF transmitters/receivers to wirelessly distribute the communications services to client devices 28 within their respective coverage areas 14(1)-14(N). The remote antenna units 16(1)-16(N) are also configured to receive analog uplink communications signals 22U from the client devices 28 in their respective coverage areas 14(1)-14(N) to be distributed to the base station 20.

It may be desired to determine information regarding the downlink communications signals 22D and/or the uplink communications signals 22U distributed in the DAS 10 for diagnostic or operational reasons. For example, it may be desired to determine the RF power level of the downlink and/or the uplink communications signals 22D, 22U. The RF power levels may be used to calibrate gain levels in the DAS 10 or determine if any communications component is not distributing a downlink and/or an uplink communications signal 22D, 22U with the proper gain. In this regard, power detectors 30(1)-30(N) (only one power detector, 30(1) is shown) can be provided at specific points in the DAS 10. The power detectors 30(1)-30(N) each provide a respective output signal 32(1)-32(N) (only one output signal, 32(1) is shown) indicative of the RF power in a downlink and/or an uplink communications signal 22D, 22U at such point or location. The output signals indicative of RF power generated by the power detectors 30(1)-30(N) are also typically analog signals. However, it may be desired to process these output signals in a digital domain, such as in a microcontroller unit (MCU) 34 shown in FIG. 1. Thus, the ADCs 12(1)-12(N) are employed in FIG. 1 to convert the analog output signals 32(1)-32(N) generated by the power detectors 30(1)-30(N) to respective digital data streams 36(1)-36(N) (only one digital data stream, 36(1) is shown). The MCU 34 may then perform processing, including inter-sample processing (e.g., calculating average power of every stream), of the digital data streams 36(1)-36(N) collected from the multiple ADCs 12(1)-12(N) at multiple locations in the DAS 10.

As the desire to obtain more information about downlink and/or uplink communications signals 22D, 22U in different frequency bands or points in the DAS 10 increases, the number of ADCs 12(1)-12(N) provided in the DAS 10 increases. Thus, the MCU 34 must sample an increased number of digital data streams 36(1)-36(N) from the ADCs 12(1)-12(N), which consumes an increasing percentage of the resources of the MCU 34. This increase in resources consumed by sampling the ADCs 12(1)-12(N) leads to fewer resources available for other tasks the MCU 34 must perform.

Several solutions to this problem of decreased MCU 34 availability exist. First, an MCU 34 with increased signal processing capabilities can be used. This may also require that the ADCs 12(1)-12(N) have increased signal processing capabilities. Providing an MCU 34 and ADCs 12(1)-12(N) in the DAS 10 with increased processing capabilities may be more expensive than providing less expensive MCU and ADCs with reduced processing capabilities. Second, an additional MCU 34 may be provided in the DAS 10 that is dedicated to sampling the ADCs 12(1)-12(N) within the required time.

No admission is made that any reference cited herein constitutes prior art. Applicant expressly reserves the right to challenge the accuracy and pertinence of any cited documents.

SUMMARY

Embodiments disclosed herein include systems and methods for simultaneous sampling of serial digital data streams from multiple analog-to-digital converters (ADCs), including in distributed antenna systems (DASs). In this regard, in one embodiment, a controller unit is provided. The controller unit is configured to sample a plurality of serial digital data streams simultaneously or substantially simultaneously (referred to herein as "simultaneously"). As a non-limiting example, the plurality of serial digital data streams may represent digital information regarding power levels at multiple points in a communications system, such as a DAS. Simultaneously sampling the serial digital data streams enables the controller unit to perform high speed measurements of all data streams at once, while consuming minimal processor time. To allow the controller unit to efficiently sample the multiple serial digital data streams simultaneously from a plurality of ADCs, the controller unit is configured to provide a plurality of data input ports. To allow the controller unit to simultaneously sample the multiple data streams from the multiple ADCs on the plurality of data input ports in an efficient parallel manner, as opposed to one at a time and serially, each of the ADCs is coupled to a common chip select port and a common clock signal port on the controller unit. The controller unit communicates a chip select signal on the chip select port to activate all of the ADCs simultaneously in order to cause each of the ADCs to provide its respective digital data stream to the respective data input port of the controller unit simultaneously for sampling. As a result, fewer or lower-cost components may be used to sample multiple ADCs.

One embodiment of the disclosure relates to a system for simultaneous sampling of serial digital data streams from multiple ADCs. The system for simultaneous sampling of serial digital data streams from multiple ADCs comprises a controller unit and a plurality of ADCs. The controller unit comprises a chip select output port; a clock output port; and a plurality of data input ports, each configured to receive a serial digital data stream. The controller unit also comprises a processor configured to communicate a chip select signal on the chip select output port to receive a serial digital data stream on each of the plurality of data input ports simultaneously. The processor is also configured to communicate a clock signal on the clock output port. Each ADC among the plurality of ADCs comprises a chip select input port electrically coupled to the chip select output port of the controller unit. Each ADC also comprises a clock input port electrically coupled to the clock output port of the controller unit, and a data output port electrically coupled to a corresponding data input port among the plurality of data input ports of the controller unit. Each ADC is configured to provide a serial digital data stream on the data output port in response to receiving the clock signal on the clock input port, if the chip select signal is present on the chip select input port.

An additional embodiment of the disclosure relates to a method for simultaneously sampling serial digital data streams from multiple ADCs. The method comprises communicating a chip select signal to a plurality of chip select input ports in a corresponding plurality of ADCs to simultaneously activate the plurality of ADCs. The method further comprises communicating a clock signal to a corresponding plurality of clock input ports in the plurality of ADCs. The method further comprises simultaneously receiving a plurality of serial digital data streams from the corresponding plurality of ADCs in a corresponding data input port among a plurality of data input ports. The method further comprises simultaneously sampling the plurality of serial digital data streams received in the plurality of data input ports from the plurality of ADCs.

An additional embodiment of the disclosure relates to a DAS comprising a plurality of communications components. The plurality of communications components comprises a central unit and a plurality of remote units. The central unit is configured to receive a downlink communications signal from a communications system and distribute the downlink communications signal over at least one downlink communications medium to a plurality of remote units. Each remote unit among the plurality of remote units is configured to receive the downlink communications signal from the central unit over the at least one downlink communications medium and distribute the downlink communications signal to a client device.

The DAS also comprises a controller unit comprising a chip select output port; a clock output port; and a plurality of data input ports, each configured to receive a serial digital data stream. The controller unit also comprises a processor configured to communicate a chip select signal on the chip select output port to receive a serial digital data stream on each of the plurality of data input ports simultaneously, and to communicate a clock signal on the clock output port.

The DAS also comprises a plurality of signal detectors associated with at least one of the plurality of communication components. Each signal detector among the plurality of signal detectors comprises an interface to receive at least a portion of an analog communications signal from the DAS, and an ADC. The ADC comprises a chip select input port electrically coupled to the chip select output port of the controller unit; a clock input port electrically coupled to the clock output port of the controller unit; and a data output port electrically coupled to a corresponding data input port among the plurality of data input ports of the controller unit. The ADC is configured to receive an analog signal from the corresponding signal detector and convert the analog signal to provide the serial digital data stream on the data output port in response to receiving the clock signal on the clock input port, if the chip select signal is present on the chip select input port.

Additional features and advantages will be set forth in the detailed description which follows, and in part will be readily apparent to those skilled in the art from the description or recognized by practicing the embodiments as described in the written description and claims hereof, as well as the appended drawings.

It is to be understood that both the foregoing general description and the following detailed description are merely exemplary, and are intended to provide an overview or framework to understand the nature and character of the claims. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Various embodiments will be further clarified by the following examples.

Figure 2:
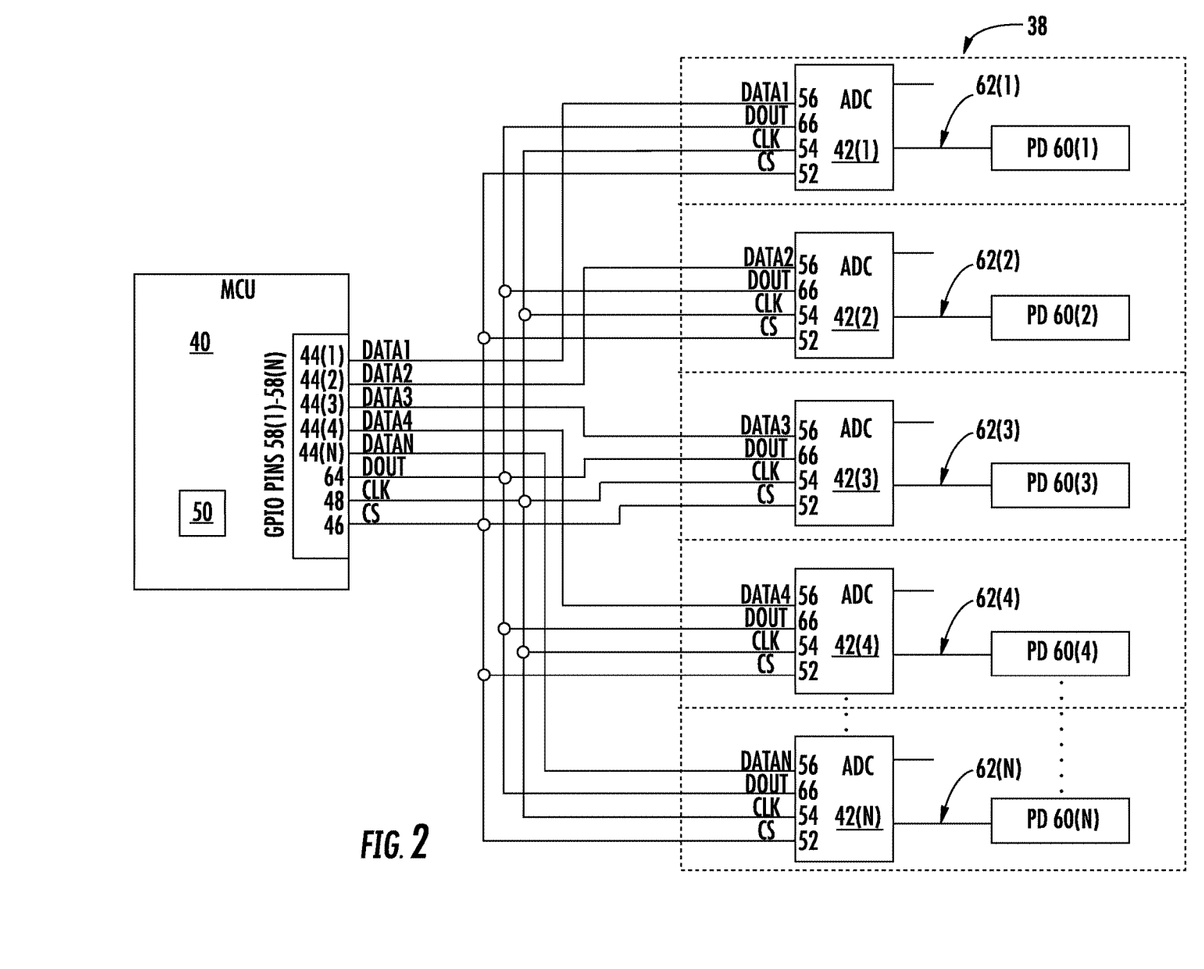
FIG. 2 is a schematic diagram of an exemplary system that includes a controller unit capable of simultaneously sampling serial digital data streams from multiple ADCs, according to one embodiment.

Embodiments disclosed herein include systems and methods for simultaneous sampling of serial digital data streams from multiple analog-to-digital converters (ADCs), including in distributed antenna systems (DASs). In this regard, FIG. 2 is a schematic diagram of an exemplary system 38 that includes a microcontroller unit (MCU) 40 as a controller unit capable of simultaneously sampling serial digital data streams DATA1-DATAN from multiple ADCs 42(1)-42(N). The MCU 40 is configured to sample a plurality of serial digital data streams DATA1-DATAN simultaneously or substantially simultaneously (referred to herein as "simultaneously"). The term "simultaneous sampling" is used herein in contrast to serial sampling, where a first sampling is concluded before the next can begin. In simultaneous sampling, multiple inputs can be processed at essentially the same time. Simultaneously sampling the serial digital data streams DATA1-DATAN enables the controller to perform high speed measurements of all data streams at once, while consuming minimal processor time. To allow the MCU 40 to efficiently sample the multiple serial digital data streams DATA1-DATAN from multiple ADCs 42(1)-42(N) simultaneously, the MCU 40 is configured to provide a plurality of data input ports 44(1)-44(N). To allow the MCU 40 to simultaneously sample the multiple serial digital data streams DATA1-DATAN from the multiple ADCs 42(1)-42(N) on the plurality of data input ports 44(1)-44(N) in an efficient parallel manner, as opposed to one at a time and serially, each of the ADCs 42(1)-42(N) is coupled to a common chip select port 46 and a common clock signal port 48 on the MCU 40. The MCU 40 communicates a chip select signal CS on the chip select port 46 to activate all of the ADCs 42(1)-42(N) simultaneously in order to cause each of the ADCs 42(1)-42(N) to provide its respective serial digital data stream DATA1-DATAN to the respective data input port 44(1)-44(N) of the MCU 40 simultaneously for sampling. As a result, fewer or lower-cost components may be used to sample multiple ADCs 42(1)-42(N).

More specifically, in the system 38 for simultaneous sampling of serial digital data streams DATA1-DATAN from multiple ADCs 42(1)-42(N) the MCU 40 comprises a chip select output port 46; a clock output port 48; and a plurality of data input ports 44(1)-44(N), each configured to receive a serial digital data stream DATA1-DATAN. The MCU 40 also comprises a processor 50 configured to communicate a chip select signal CS on the chip select output port 46 to receive a serial digital data stream DATA1-DATAN on each of the plurality of data input ports 44(1)-44(N) simultaneously. The processor 50 is also configured to communicate a clock signal CLK on the clock output port 48. Each ADC 42 among the plurality of ADCs 42(1)-42(N) comprises a chip select input port 52 electrically coupled to the chip select output port 46 of the MCU 40. Each ADC 42 also comprises a clock input port 54 electrically coupled to the clock output port 48 of the MCU 40, and a data output port 56 electrically coupled to a corresponding data input port 44 among the plurality of data input ports 44(1)-44(N) of the MCU 40. Each ADC 42 is configured to provide a serial digital data stream DATA1-DATAN on the data output port 56 in response to receiving the clock signal CLK on the clock input port 54, if the chip select signal CS is present on the chip select input port 52.

In the embodiment of FIG. 2, the various ports of the MCU 40 are appropriately configured general purpose input/output (GPIO) pins 58(1)-58(N). Before discussing the system 38 for simultaneously sampling serial digital data streams from multiple ADCs, the components of the system in FIG. 2 will be described below. In this example, each ADC 42 is configured to convert an analog signal obtained from a corresponding power detector (PD) 60(1)-60(N) into a digital signal. The PDs 60(1)-60(N) each provide a respective output signal 62(1)-62(N) indicative of the power in an analog signal at a point or location where the respective PD 60(1)-60(N) is located. The output signals 62(1)-62(N) indicative of power generated by the PDs 60(1)-60(N) are also typically analog signals. However, processing these output signals 62(1)-62(N) in a digital domain, such as in the MCU 40, may be desired. Thus, the ADCs 42(1)-42(N) are employed to convert the analog output signals 62(1)-62(N) generated by the PDs 60(1)-60(N) to respective multiple serial digital data streams DATA1-DATAN. The MCU 40 may then perform processing, including inter-sample processing (e.g., calculating average power of every stream), of the multiple serial digital data streams DATA1-DATAN collected from the multiple ADCs 42(1)-42(N).

In FIG. 2, the MCU 40 is configured to sample the ADCs 42(1)-42(N) simultaneously. Simultaneously sampling the ADCs 42(1)-42(N) enables the MCU 40 to perform high speed measurements of the multiple serial digital data streams DATA1-DATAN collected from the multiple ADCs 42(1)-42(N) at once, while consuming minimal processor time. To allow the MCU 40 to sample the multiple serial digital data streams DATA1-DATAN simultaneously from a plurality of ADCs 42(1)-42(N), the MCU 40 is configured to provide a plurality of data input ports 44(1)-44(N). To allow the MCU 40 to simultaneously sample the multiple serial digital data streams DATA1-DATAN from the multiple ADCs 42(1)-42(N) on the plurality of data input ports 44(1)-44(N) in an efficient, parallel manner, as opposed to serially sampling one ADC 42 at a time, each of the ADCs 42(1)-42(N) is coupled to a common chip select port 46 and a common clock signal port 48 on the MCU 40. In operation, the MCU 40 communicates a chip select signal CS on the chip select port 46 to activate all of the ADCs 42(1)-42(N) simultaneously. The MCU 40 also communicates a clock signal CLK on the clock signal port 48 to cause each of the ADCs 42(1)-42(N) to provide its respective serial digital data stream DATA1-DATAN to the respective data input port 44(1)-44(N) of the MCU 40 simultaneously for sampling. In this embodiment, the MCU 40 is additionally configured to provide a data output signal (or configuration signal) DOUT on a data output port 64 that is shared among all of the ADCs 42(1)-42(N). Each ADC 42 receives this signal on a data input port 66. This data output signal DOUT can be used to configure the ADCs 42(1)-42(N). For example, the ADCs 42(1)-42(N) can be configured to use a specific conversion algorithm, use a specific precision, or convert a specific channel. As discussed previously, in this embodiment, the plurality of data input ports 44(1)-44(N), the chip select port 46, the clock signal port 48, and the data output port 64 are appropriately configured GPIO pins 58(1)-58(N) of the MCU 40.

Figure 3:
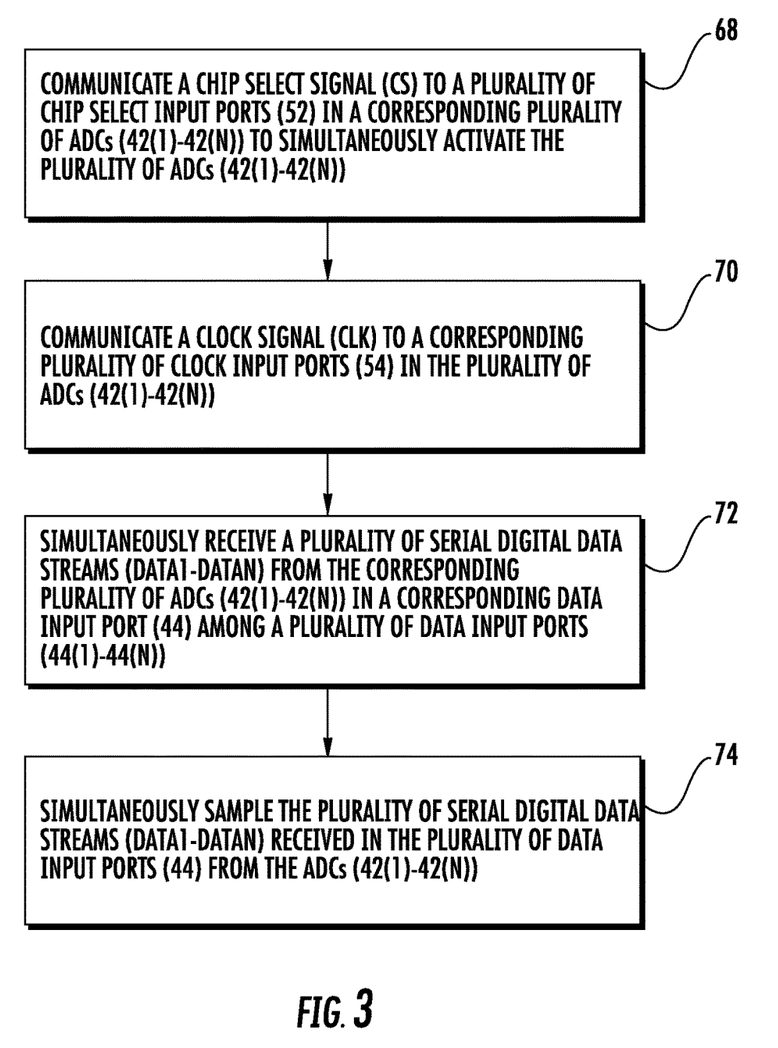
FIG. 3 is a flowchart illustrating an exemplary process of operating the controller unit in FIG. 2 for simultaneously sampling serial digital data streams from multiple ADCs, according to one embodiment.
Figure 4:
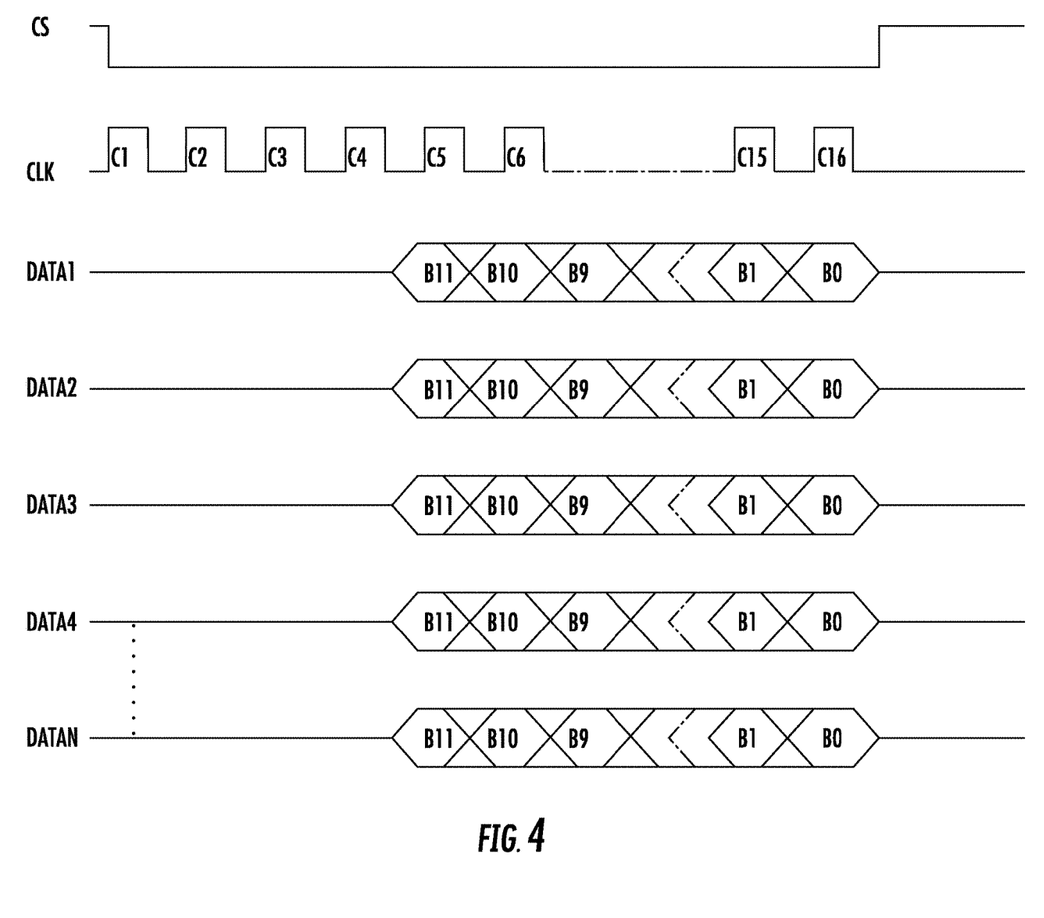
FIG. 4 illustrates a relationship between a chip select signal, a clock signal, and data output signals corresponding to an exemplary operation of the system of FIG. 2, according to one embodiment.

To further explain an exemplary process of operating the system 38 in FIG. 2 for simultaneously sampling serial digital data streams DATA1-DATAN from multiple ADCs 42(1)-42(N), the flowchart in FIG. 3 is provided. Additionally, FIG. 4 illustrates a relationship between the chip select signal CS, the clock signal CLK, and the serial digital data streams DATA1-DATAN corresponding to an exemplary operation of the system of FIG. 2, according to one embodiment. The process of FIG. 3 and the signals shown in FIG. 4 can represent one embodiment where each of the ADCs 42(1)-42(N) is configured to provide the serial digital data stream DATA1-DATAN according to a serial peripheral interface (SPI) protocol. Other communications protocols could also be used. As discussed above, the MCU 40 first communicates a chip select signal CS to a plurality of chip select input ports 52 in a corresponding plurality of ADCs 42(1)-42(N) to simultaneously activate the plurality of ADCs 42(1)-42(N) (block 68). This is shown in FIG. 4 by the chip select signal CS transitioning from a high value to a low value. Other embodiments may communicate a chip select signal CS by transitioning from a low value to a high value, depending on implementation of the ADCs 42(1)-42 (N). Next, the MCU 40 communicates a clock signal CLK to a corresponding plurality of clock input ports 54 in the plurality of ADCs 42(1)-42(N) (block 70). The CLK signal oscillates between a low value to a high value and back to the low value. The clock pulses of the clock pulse signal CLK are numbered C1 through C16 in FIG. 4. Because the ADCs 42(1)-42(N) receive the same chip select signal CS and the same clock signal CLK, the ADCs 42(1)-42(N) simultaneously convert the respective analog signals to digital signals. As discussed above, this conversion takes a specific amount of time to complete. After completion of the conversion, the ADCs 42(1)-42(N) will begin to provide the resultant data to the MCU 40. The MCU 40 simultaneously receives a plurality of serial digital data streams DATA1-DATAN from the corresponding plurality of ADCs 42(1)-42(N) in a corresponding data input port 44 among a plurality of data input ports 44(1)-44(N) (block 72). In FIG. 4, no changes are shown in the serial digital data streams DATA1-DATAN during the first four clock pulses C1-C4 due to the amount of time the ADCs 42(1)-42(N) need to complete the conversion process and begin transmitting data. In this embodiment, the ADCs 42(1)-42(N) take four clock pulses to complete the conversion process. During the fifth clock pulse, each of the serial digital data streams DATA1-DATAN may transition to either a low value or a high value, depending on the value of the data (i.e., zero or one). This first bit transmitted during the fifth clock pulse is labelled "B11" because in this embodiment, the ADCs 42(1)-42(N) provide twelve bits of precision and the ADCs 42(1)-42(N) communicate the most significant bit first. The clock pulses continue and the serial digital data streams DATA1-DATAN are communicated simultaneously. Clock pulse sixteen C16 is the last clock pulse in this embodiment, and the last bit, "B0," is transmitted by each of the ADCs 42(1)-42(N). Now that the MCU 40 has received the data on the data input ports 44(1)-44(N), the MCU 40 may simultaneously sample the plurality of serial digital data streams DATA1-DATAN received in the plurality of data input ports 44(1)-44(N) from the ADCs 42(1)-42(N) (block 74). In some embodiments, the MCU 40 stops communicating a chip select signal CS on the chip select port 46. This is shown by the chip select signal CS transitioning from the low value to the high value in FIG. 4. In some embodiments, this transition deactivates the ADCs 42(1)-42(N). The process described in FIG. 3 can be initiated or repeated as desired, because as discussed above, the ADCs 42(1)-42(N) may be configured to provide the result of the conversion in more than one bit of digital data, usually eight data bits or more. One embodiment that repeats this process is described next.

Figure 5:
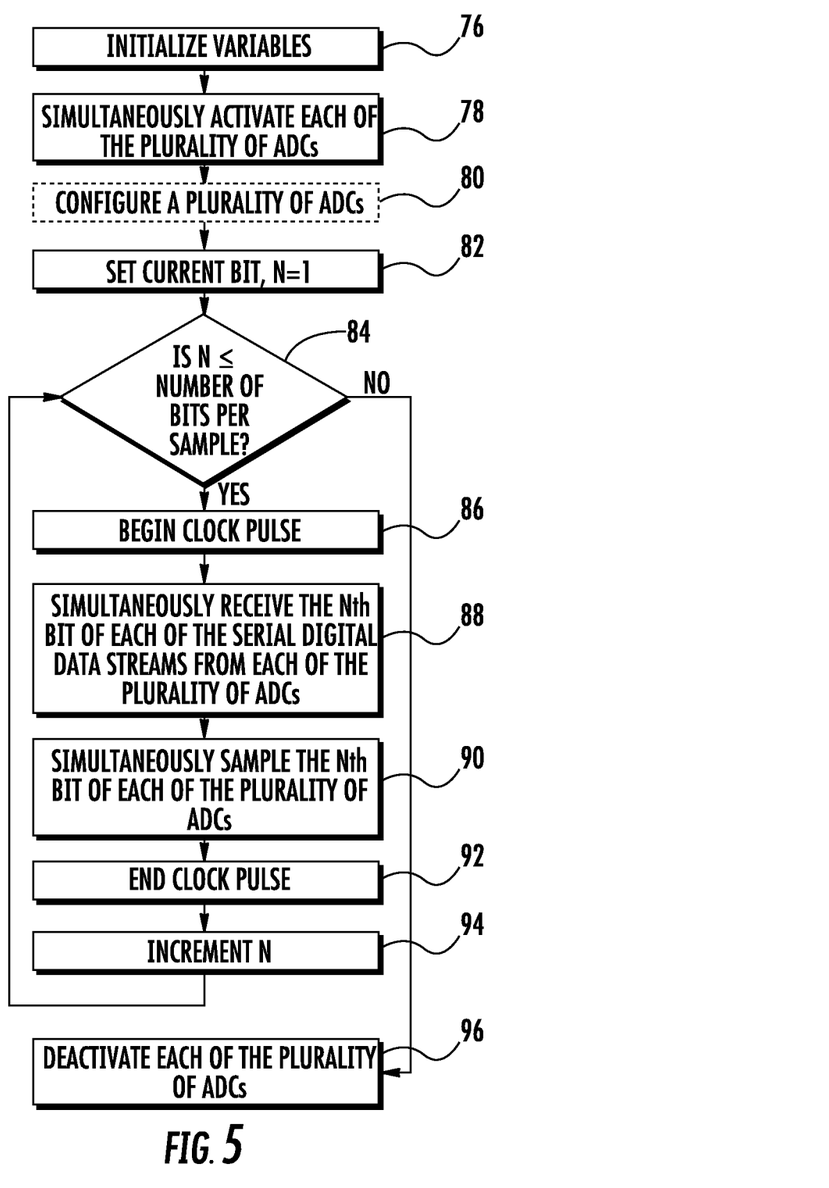
FIG. 5 is a more detailed flowchart illustrating an exemplary process of operating the controller unit in FIG. 2 for simultaneously sampling serial digital data streams from multiple ADCs, according to one embodiment.

FIG. 5 is a more detailed flowchart illustrating a process for simultaneously sampling serial digital data streams DATA1-DATAN from multiple ADCs 42(1)-42(N), according to one embodiment. First, a controller unit, such as the MCU 40 of FIG. 2, will initialize variables that will be used in the process (block 76). In some implementations, this may involve assigning each variable a value of zero (0) or some other initial value. Next, the MCU 40 communicates a chip select signal to a plurality of chip select input ports 52 in a corresponding plurality of ADCs 42(1)-42(N) to simultaneously activate each of the plurality of ADCs 42(1)-42(N) (block 78). In one implementation, the chip select signal begins with a transition of the signal from a high value to a low value, as discussed previously in relation to the chip select signal CS in FIG. 3. Other implementations can reverse or otherwise alter this transition. Optionally, the MCU 40 may also configure the plurality of ADCs 42(1)-42(N) as discussed above (block 80). At this point, the MCU 40 knows the number of bits of data to expect in the serial digital data streams DATA1-DATAN transmitted by each of the ADCs 42(1)-42(N) either by prior configuration or from the previous configuration step. A counter representing the current bit, N, to be sampled from the serial digital data streams DATA1-DATAN is set to one (1) in preparation for receiving the first data bit (block 82). Depending on implementation, this counter may instead start from zero (0), or from a higher number that is subsequently decremented. Also, as discussed above, ADCs 42(1)-42(N) may be configured to provide the most significant bit or the least significant bit first. Next, a loop begins that first checks whether the process has completed. This completion check is performed by comparing the counter representing the current bit, N, to be sampled from the serial digital data streams DATA1-DATAN with the number of bits of data to expect in the serial digital data streams DATA1-DATAN transmitted by each of the ADCs 42(1)-42(N) (block 84). If there are bits remaining to sample, the MCU 40 begins a clock pulse which communicates a clock signal to a corresponding plurality of clock input ports 48 in the plurality of ADCs 42(1)-42(N) (block 86). As discussed above in relation to the clock signal CLK in FIG. 3, the beginning of the clock pulse is a transition from a low value to a high value, in this example. Other implementations can reverse or otherwise alter this transition. The MCU 40 simultaneously receives the Nth bit of each of a plurality of serial digital data streams DATA1-DATAN from the corresponding plurality of ADCs 42(1)-42(N) in a corresponding data input port 44 among a plurality of data input ports 44(1)-44(N) (block 88). Now that the MCU 40 has received the Nth bit on the data input ports 44(1)-44(N), the MCU 40 may simultaneously sample the Nth bit of the plurality of serial digital data streams DATA1-DATAN received in the plurality of data input ports 44(1)-44(N) from the ADCs 42(1)-42(N) (block 90). After sampling the Nth bit, the MCU 40 ends the clock pulse (block 92). This transition is the opposite of the beginning of the clock pulse and, in this example, is a transition from a high value to a low value. The MCU 40 then increments the counter representing the current bit, N, to be sampled from the serial digital data streams DATA1-DATAN (block 94) and returns to block 84 to check whether the process has completed. If there are no bits remaining to sample, the MCU 40 stops communicating the chip select signal to the plurality of chip select input ports 52 in the corresponding plurality of ADCs 42(1)-42(N) to simultaneously deactivate each of the plurality of ADCs 42(1)-42(N) (block 96).

Figure 6:
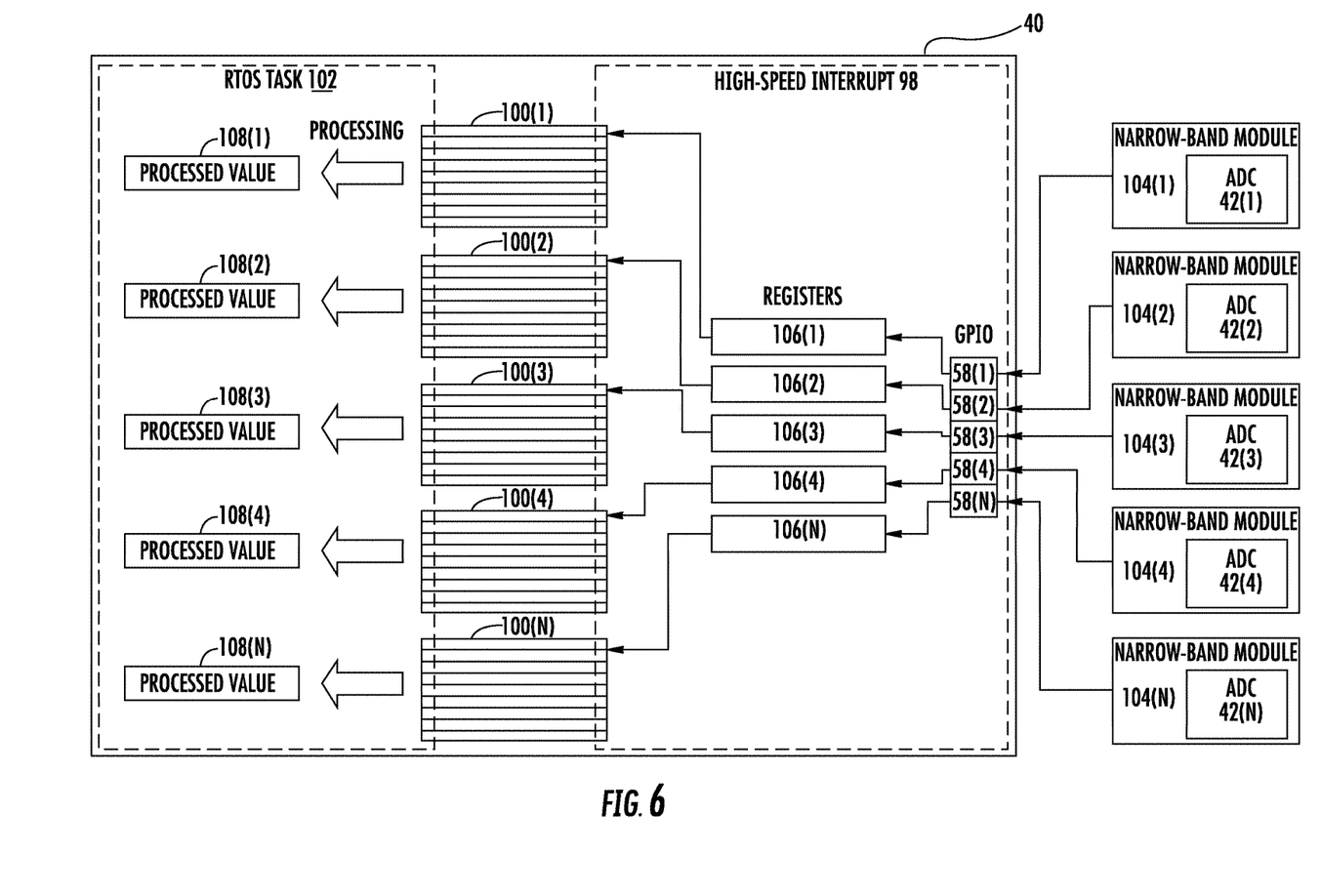
FIG. 6 illustrates a logical configuration of a controller unit simultaneously sampling serial digital data streams from multiple ADCs, according to one embodiment.

FIG. 6 illustrates a logical configuration of a controller unit, such as the MCU 40 of FIG. 2, simultaneously sampling serial digital data streams DATA1-DATAN from multiple ADCs 42(1)-42(N), according to one embodiment. This logical configuration is only one possible implementation and other configurations exist. In this embodiment, the MCU 40 is shown as consisting of two logical processing portions. The first logical processing portion of the MCU 40 is the high-speed interrupt portion 98 that is configured to obtain samples to store in memory blocks 100(1)-100(N). The second logical processing portion of the MCU 40 is the real-time operating system (RTOS) task portion 102 that is configured to process the samples stored in memory blocks 100(1)-100(N) obtained by the high-speed interrupt portion 98. Both of these logical processing portions of the MCU 40 must share processing resources such as processing time. As discussed previously, by simultaneously sampling serial digital data streams DATA1-DATAN from multiple ADCs 42(1)-42(N), fewer processing resources need to be used in the high-speed interrupt portion 98 of the MCU 40, which allows for more processing resources to be available for the RTOS task portion 102 to process samples stored in memory blocks 100(1)-100(N) obtained by the high-speed interrupt portion 98 and for other MCU 40 tasks.

FIG. 6 shows an arrangement similar to the one in FIG. 2, where serial digital data streams DATA1-DATAN are simultaneously sampled. In this embodiment, the serial digital data streams DATA1-DATAN are sampled from N narrow-band modules 104(1)-104(N). Each of these narrow-band modules 104(1)-104(N) are configured to provide serial digital data streams DATA1-DATAN indicative of some value related to a narrow-band analog RF signal. These narrow-band modules 104(1)-104(N) include ADCs 42(1)-42(N) and a signal detector (not shown) capable of detecting some value related to the narrow-band analog RF signal.

The high-speed interrupt portion 98 of the MCU 40 is shown simultaneously receiving the serial digital data streams DATA1-DATAN on a plurality of GPIO pins 58 from the narrow-band modules 104(1)-104(N). The serial digital data streams DATA1-DATAN are then stored in registers 106(1)-106(N) until all bits of the serial digital data streams DATA1-DATAN are sampled. The high-speed interrupt portion 98 of the MCU 40 can then place the data received from the serial digital data streams DATA1-DATAN from the registers 106(1)-106(N) to the corresponding memory blocks 100(1)-100(N). In FIG. 6, the memory blocks 100(1)-100(N) are shown as separate memory blocks corresponding to the serial digital data streams DATA1-DATAN, but other implementations are possible and the samples may all be located in the same memory block.

Once the memory blocks 100(1)-100(N) are full (i.e., the memory blocks 100(1)-100(N) contain as many samples as required), the RTOS task portion 102 can process the samples in memory blocks 100(1)-100(N) to compute processed values 108(1)-108(N) corresponding to the serial digital data streams DATA1-DATAN. In an example where the serial digital data streams DATA1-DATAN are indicative of RF power, the processing by the RTOS task portion 102 can be performed in order to determine peak and average power for each of the narrow-band modules 104(1)-104(N).

Figure 7:
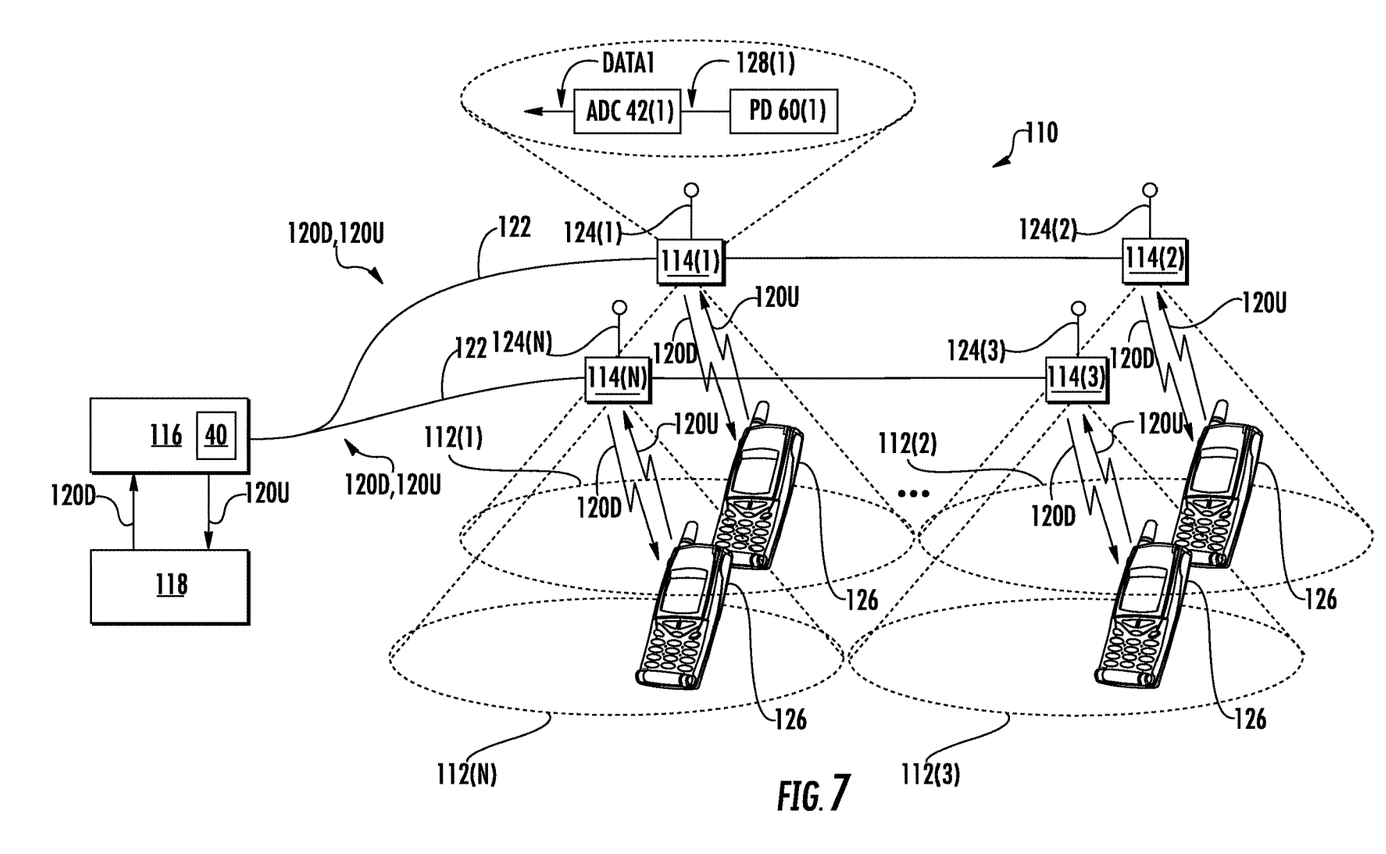
FIG. 7 is a schematic diagram of an exemplary DAS capable of distributing RF communications services to client devices, wherein the DAS may include multiple ADCs that can convert analog data regarding communications signals to digital data, and further comprising a microcontroller unit (MCU) capable of simultaneously sampling serial digital data streams from the multiple ADCs, according to one embodiment.

FIG. 7 illustrates an exemplary DAS 110 that can include ADCs 42(1)-42(N) (only one ADC, 42(1) is shown) to convert analog signals distributed in the DAS 110 to digital values. The DAS 110 provides distribution of communications signals to provide communications services to coverage areas 112(1)-112(N) in the DAS 110, where N is the number of coverage areas. These communications services can include cellular services, such as a cellular service operating using the Long Term Evolution (LTE) cellular protocol, for example. The coverage areas 112(1)-112(N) may be remotely located. In this case, the remote coverage areas 112(1)-112(N) are created by and centered on remote antenna units 114(1)-114(N) coupled to a central unit 116 (e.g., a head-end controller or head-end unit). The central unit 116 may be communicatively coupled to a base station 118. In this regard, the central unit 116 receives analog downlink communications signals 120D from the base station 118 to be distributed to the remote antenna units 114(1)-114(N). The remote antenna units 114(1)-114(N) are configured to receive the downlink communications signals 120D from the central unit 116 over a communications medium 122 to be distributed to the respective coverage areas 112(1)-112(N) of the remote antenna units 114(1)-114(N). Each remote antenna unit 114(1)-114(N) may include one or more RF transmitters/receivers (not shown) and respective antennas 124(1)-124(N) operably coupled to the RF transmitters/receivers to wirelessly distribute the communications services to client devices 126 within their respective coverage areas 112(1)-112(N). The remote antenna units 114(1)-114(N) are also configured to receive analog uplink communications signals 120U from the client devices 126 in their respective coverage areas 112(1)-112(N) to be distributed to the base station 118.

It may be desired to determine information regarding the downlink communications signals 120D and/or the uplink communications signals 120U distributed in the DAS 110 for diagnostic or operational reasons. For example, it may be desired to determine the RF power level of the downlink and/or the uplink communications signals 120D, 120U. The RF power levels may be used to calibrate gain levels in the DAS 110 or determine if any communications component is not distributing a downlink and/or an uplink communications signal 120D, 120U with the proper gain. In this regard, power detectors 60(1)-60(N) (only one power detector, 60(1) is shown) can be provided at specific points in the DAS 110. The power detectors 60(1)-60(N) each provide a respective output signal 128(1)-128(N) (only one output signal, 128(1) is shown) indicative of the RF power in a downlink and/or an uplink communications signal 120D, 120U at such point or location. The output signals 128(1)-128(N) indicative of RF power generated by the power detectors 60(1)-60(N) are also typically analog signals. However, processing these output signals 128(1)-128(N) in a digital domain, such as in an MCU 40 shown in FIG. 7, may be desired. Thus, the ADCs 42(1)-42(N) are employed in FIG. 7 to convert the analog output signals 128(1)-128(N) generated by the power detectors 60(1)-60(N) to respective serial digital data streams DATA1-DATAN (only one serial digital data stream, DATA1 is shown). The MCU 40 may then perform processing, including inter-sample processing (e.g., calculating average power of every stream), of the serial digital data streams DATA1-DATAN collected from the multiple ADCs 42(1)-42(N) at multiple locations in the DAS 110. In FIG. 7, the MCU 40 is shown inside the central unit 116. In this embodiment, the MCU 40 can receive serial digital data streams DATA1-DATAN from ADCs 42(1)-42(N) located in separate remote antenna units 114(1)-114(N) or from multiple ADCs 42(1)-42(N) located in one remote antenna unit 114(1), for example. Also, the MCU 40 can be physically located in different places depending on implementation. For example, the MCU 40 could be located inside remote antenna unit 114(1) and receive serial digital data streams DATA1-DATAN from ADCs 42(1)-42(N) also located inside remote antenna unit 114(1). In this embodiment, each of the ADCs 42(1)-42(N) may be configured to convert a signal from corresponding PDs 60(1)-60(N) associated with different frequency bands.

As one example application of the system 38 (shown in FIG. 2) for simultaneously sampling serial digital data streams DATA1-DATAN from multiple ADCs 42(1)-42(N), it may be desired to measure the power level of a communication signal transmitted or received at each of five antennas, such as antennas 124(1)-124(N) in DAS 110, to provide system feedback information. In the Long Term Evolution (LTE) cellular protocol, data is formatted into LTE symbols with a duration of 71.4 microsecond (p) (0.5 millisecond (ms)/slot, 7 symbols/slot). If the DAS 110 of FIG. 7 is operating using the LTE cellular protocol, the MCU 40 may need to sample the analog power level of the LTE signal and convert it to a digital format at a rate faster than the symbol rate (faster than one sample per 71.4 µs). Since the system includes multiple frequency bands, in this case five, sampling the LTE signal in multiple circuits belonging to multiple frequency bands may be required. In this example, the MCU 40 may use the readings arriving from the multiple measurement points for calculating peak and average power of the LTE signal or for other tasks, such as automatic level control, overload protection, or others.

Sampling a plurality of measurement points sequentially (as in the prior art) at such a high rate (faster than one sample per 71.4 µs) and providing these samples to an MCU 40 may require the use of a dedicated MCU 40, since the transfer of such high-rate readings to the MCU 40 may keep its serial communication line continuously busy and may require the MCU 40 to stay in an "Interrupt" state during a significant portion of its "real time." For example, in order to sample each signal during each LTE symbol, the corresponding ADCs 42(1)-42(N) may be required to sample each PD 60 every 50 µs to allow the MCU 40 additional time for processing before the next LTE symbol begins. If the MCU 40 must sample each ADC 42 sequentially, each ADC 42 must be sampled within a time frame of 50 µs/5=10 µs. If the data of each sample is provided in twelve bits and four clock cycles are required for the sample to be converted by the ADC 42, then the data rate over a serial communications link will have to be at least (12+4 bits)/10 µs=1.6 Mbps. In this case, the sampling task will keep the MCU 40 continuously busy and will not leave any processing time for other tasks.

In contrast, if an MCU 40 and ADCs 42(1)-42(N) with this data rate are used in the system 38 for simultaneous sampling of serial digital data streams DATA1-DATAN from multiple ADCs 42(1)-42(N) as in FIG. 2, all ADCs 42(1)-42(N) will be sampled simultaneously. Instead of taking 10 µs*5=50 µs to sample the five ADCs 42(1)-42(N), the sampling will only take 10 µs. This leaves an additional 50 µs−10 µs=40 µs for the MCU 40 to complete other tasks. This may alleviate the need for a dedicated MCU 40, reducing the cost of the system. Alternatively, or additionally, this improved efficiency may allow for the use of a lower-cost MCU 40 or ADCs 42(1)-42(N) because a high data rate is not required.

Figure 8:
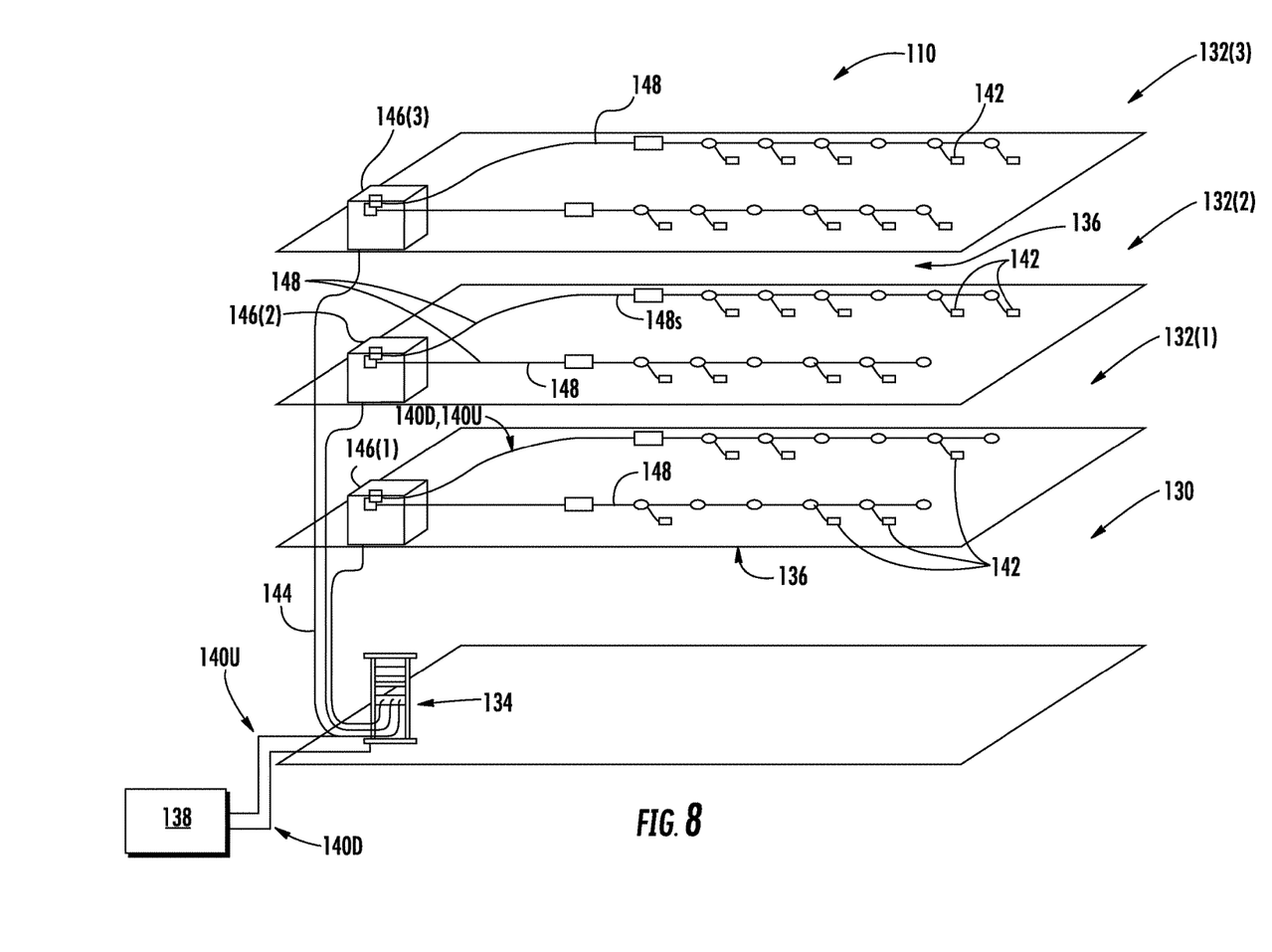
FIG. 8 is a partially schematic cut-away diagram of an exemplary building infrastructure in which the DAS in FIG. 7 can be employed.

The DAS 110 in FIG. 7 may also be provided in an indoor environment, as illustrated in FIG. 8. FIG. 8 is a partially schematic cut-away diagram of a building infrastructure 130 employing the DAS 110 described herein. The building infrastructure 130 in this embodiment includes a first (ground) floor 132(1), a second floor 132(2), and a third floor 132(3). The floors 132(1)-132(3) are serviced by a central unit 134 to provide antenna coverage areas 136 in the building infrastructure 130. The central unit 134 is communicatively coupled to a base station 138 to receive downlink communications signals 140D from the base station 138. The central unit 134 is communicatively coupled to remote antenna units 142 to receive uplink communications signals 140U from the remote antenna units 142, as discussed above. The downlink and uplink communications signals 140D, 140U communicated between the central unit 134 and the remote antenna units 142 are carried over a riser cable 144. The riser cable 144 may be routed through interconnect units (ICUs) 146(1)-146(3) dedicated to each floor 132(1)-132(3) that route the downlink and uplink communications signals 140D, 140U to the remote antenna units 142 and also provide power to the remote antenna units 142 via array cables 148.

Figure 9:
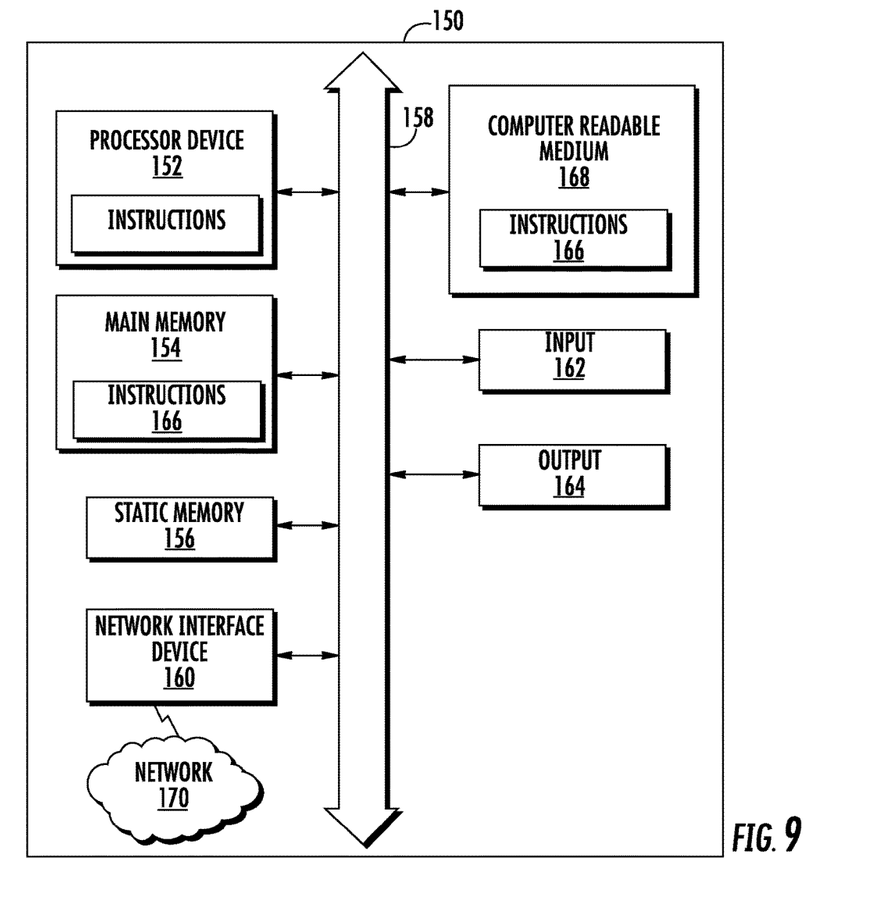
FIG. 9 is a schematic diagram of a generalized representation of an exemplary controller unit that can be included in any central unit, remote unit, wireless client device, and/or any other components of a DAS or other system, for simultaneous sampling of serial digital data streams from multiple ADCs, wherein the exemplary controller unit is adapted to execute instructions from an exemplary computer-readable medium.

In this regard, a controller unit 150 in FIG. 9 may include a set of instructions that may be executed to simultaneously sample serial digital data streams from multiple ADCs. The controller unit 150 may be connected (e.g., networked) to other machines in a LAN, an intranet, an extranet, or the Internet. While only a single device is illustrated, the term "device" shall also be taken to include any collection of devices that individually or jointly execute a set (or multiple sets) of instructions to perform any one or more of the methodologies discussed herein. The controller unit 150 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server or a user's computer.

The exemplary controller unit 150 in this embodiment includes a processing device or processor 152, a main memory 154 (e.g., read-only memory (ROM); flash memory; dynamic random access memory (DRAM), such as synchronous DRAM (SDRAM); etc.), and a static memory 156 (e.g., flash memory, static RAM (SRAM), etc.), which may communicate with each other via a data bus 158. Alternatively, the processor 152 may be connected to the main memory 154 and/or the static memory 156 directly or via some other connectivity means. The processor 152 may be a controller, and the main memory 154 or the static memory 156 may be any type of memory.

The processor 152 represents one or more general-purpose processing devices, such as a microprocessor, central processing unit, or the like. More particularly, the processor 152 may be a complex instruction set computing (CISC) microprocessor, a reduced instruction set computing (RISC) microprocessor, a very long instruction word (VLIW) microprocessor, a processor implementing other instruction sets, or other processors implementing a combination of instruction sets. The processor 152 is configured to execute processing logic in instructions for performing the operations and steps discussed herein.

The controller unit 150 may further include a network interface device 160. The controller unit 150 also may or may not include an input 162, configured to receive input and selections to be communicated to the controller unit 150 when executing instructions. The controller unit 150 also may or may not include an output 164, including but not limited to a display, a video display unit (e.g., a liquid crystal display (LCD) or a cathode ray tube (CRT)), an alphanumeric input device (e.g., a keyboard), and/or a cursor control device (e.g., a mouse).

The controller unit 150 may or may not include a data storage device that includes instructions 166 stored in a computer-readable medium 168. The instructions 166 may also reside, completely or at least partially, within the main memory 154 and/or within the processor 152 during execution thereof by the controller unit 150, the main memory 154 and the processor 152 also constituting computer-readable media. The instructions 166 may further be transmitted or received over a network 170 via the network interface device 160.

While the computer-readable medium 168 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding, or carrying a set of instructions for execution by the processing device and that cause the processing device to perform any one or more of the methodologies of the embodiments disclosed herein. The term "computer-readable medium" shall accordingly be taken to include, but not be limited to, solid-state memories, optical media, and magnetic media.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a controller unit (or other electronic devices) to perform a process according to the embodiments disclosed herein. A machine-readable medium includes any mechanism for storing or transmitting information in a form readable by a machine (e.g., a computer). For example, a machine-readable medium includes: a machine-readable storage medium (e.g., ROM, random access memory ("RAM"), a magnetic disk storage medium, an optical storage medium, flash memory devices, etc.); and the like.

Unless specifically stated otherwise and as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data and memories represented as physical (electronic) quantities within the computer system's registers into other data similarly represented as physical quantities within the controller unit memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The components of the distributed antenna systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware, and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips, that may be references throughout the above description, may be represented by voltages, currents, electromagnetic waves, magnetic fields, or particles, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It will be apparent to those skilled in the art that various modifications and variations can be made without departing from the spirit or scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. An apparatus for simultaneous sampling of digital data streams from multiple analog-to-digital converters (ADCs), comprising:
   a chip select output port configured to be coupled to a chip select input port of each of a plurality of ADCs;
   a clock output port configured to be coupled to a clock input port of each of the plurality of ADCs;
   a plurality of data input ports, each of the plurality of data input ports configured to be coupled to a corresponding data output port among a plurality of data output ports of the plurality of ADCs; and
   a processor configured to:
      communicate a chip select signal on the chip select output port to receive a serial digital data stream on each of the plurality of data input ports simultaneously; and
      communicate a clock signal on the clock output port,
   wherein each of the plurality of data input ports is configured to simultaneously receive a digital data stream from two or more of the plurality of ADCs in response to communicating the clock signal from the clock output port to the clock input port of each of the plurality of ADCs and when the chip select signal from the chip select output port has been communicated to a respective chip select input port of a respective ADC among the plurality of ADCs.

2. The apparatus of claim 1, further comprising a plurality of general purpose input/output (GPIO) pins comprising:
   a first GPIO pin configured as the chip select output port; and
   a second GPIO pin configured as the clock output port.

3. The apparatus of claim 1, further comprising a plurality of other GPIO pins configured as the plurality of data input ports.

4. The apparatus of claim 1, further comprising at least one data output port, wherein the at least one data output port is configured to be coupled to a respective data input port of one or more of the plurality of ADCs.

5. The apparatus of claim 4, wherein the at least one data output port is configured to send a channel configuration signal to the respective data input port of one or more of the plurality of ADCs to determine a channel to convert.

6. The apparatus of claim 4, wherein the at least one data output port is configured to send a data configuration signal to the respective data input port of one or more of the plurality of ADCs to configure a number of bits for the corresponding one of the plurality of ADCs to provide in the digital data stream.

7. The apparatus of claim 4, wherein the at least one data output port is configured to send a conversion signal to the respective data input port of one or more of the plurality of ADCs to configure a method of conversion for the corresponding one of the plurality of ADCs to provide in the digital data stream.

8. The apparatus of claim 1, wherein each of the plurality of data input ports is further configured to receive the digital data stream at a data rate of at least 1.6 megabits per second (Mbps).

9. The apparatus of claim 1, wherein each of the plurality of data input ports is further configured to receive the digital data stream simultaneously within 50 microseconds (p).

10. An analog-to-digital converter (ADC), comprising:
    a chip select input port configured to be coupled to a chip select output port of a controller unit and configured to receive a chip select signal from the chip select output port of the controller unit;
    a clock input port configured to be coupled to a clock output port of the controller unit and configured to receive a clock signal from the clock output port of the controller unit; and
    a data output port configured to be coupled to a corresponding data input port among a plurality of data input ports of the controller unit and configured to provide a digital data stream to the corresponding data input port, wherein the ADC is configured to provide the digital data stream on the data output port in response to receiving the clock signal on the clock input port and the chip select signal being present on the chip select input port.

11. The ADC of claim 10, wherein the ADC is configured to provide the digital data stream on the data output port according to a serial peripheral interface (SPI) protocol.

12. The ADC of claim 10, further comprising a data input port configured to be coupled to a data output port of the controller unit, and the ADC being further configured to determine a channel to convert based on a signal received on the data input port.

13. The ADC of claim 10, wherein the ADC is further configured to receive an analog signal from a power detector and convert the analog signal received from the power detector to provide the digital data stream.

14. The ADC of claim 13, wherein:
the power detector is disposed at a point in a distributed antenna system (DAS); and
the power detector is configured to detect a power of a communications signal at the point in the DAS.

15. The ADC of claim 14, wherein the DAS is configured to provide communications services based on a Long Term Evolution (LTE) standard.

16. The ADC of claim 10, wherein the ADC is further configured to provide the digital data stream on the data output port at a data rate of at least 1.6 Mbps.

17. A wireless communication system (WCS), comprising:
a plurality of communications components, comprising:
a central unit configured to receive a downlink communications signal from a communications system and distribute the downlink communications signal over at least one downlink communications medium to a plurality of remote units,
wherein each remote unit among the plurality of remote units is configured to receive the downlink communications signal from the central unit over the at least one downlink communications medium and distribute the downlink communications signal to a client device; and
a controller unit, comprising:
a chip select output port configured to be coupled to a chip select input port of each of a plurality of analog-to-digital converters (ADCs);
a clock output port configured to be coupled to a clock input port of each of the plurality of ADCs;
a plurality of data input ports, each of the plurality of data input ports configured to be coupled to a corresponding data output port among a plurality of data output ports of the plurality of ADCs; and
a processor configured to:
communicate a chip select signal on the chip select output port to receive a serial digital data stream on each of the plurality of data input ports simultaneously; and
communicate a clock signal on the clock output port,
wherein each of the plurality of data input ports is configured to simultaneously receive a digital data stream from two or more of the plurality of ADCs in response to communicating the clock signal from the clock output port to the clock input port of each of the plurality of ADCs and when the chip select signal from the chip select output port has been communicated to a respective chip select input port of a respective ADC among the plurality of ADCs.

18. The WCS of claim 17, further comprising:
a plurality of signal detectors associated with at least one of the plurality of communications components, wherein each signal detector among the plurality of signal detectors comprises:
an interface to receive at least a portion of an analog communications signal from the WCS; and
an ADC comprising:
a chip select input port electrically coupled to the chip select output port of the controller unit;
a clock input port electrically coupled to the clock output port of the controller unit; and
a data output port electrically coupled to a corresponding data input port among the plurality of data input ports of the controller unit;
the ADC configured to:
receive an analog signal from the corresponding signal detector; and
convert the analog signal to provide the digital data stream on the data output port in response to receiving the clock signal on the clock input port, if the chip select signal is present on the chip select input port.

19. The WCS of claim 17, wherein the central unit is further configured to receive an uplink communications signal from the plurality of remote units over at least one uplink communications medium and distribute the uplink communications signal, and each remote unit among the plurality of remote units is configured to receive the uplink communications signal from the client device and distribute the uplink communications signal to the central unit over the at least one uplink communications medium.

20. The WCS of claim 19, wherein each analog signal received from the signal detector corresponding to each ADC among the plurality of ADCs is configured to detect power in a different frequency band.

21. The WCS of claim 17, wherein the controller unit is further configured to receive the serial digital data stream on each of the plurality of data input ports simultaneously within 50 microseconds (µs).

22. The WCS of claim 17, wherein:
the central unit comprises:
at least one electrical-to-optical (E-O) converter configured to convert the received downlink communications signal comprising an electrical downlink communications signal to an optical downlink communications signal, and distribute the optical downlink communications signal over the at least one downlink communications medium comprising at least one optical downlink communications medium to the plurality of remote units; and
each remote unit among the plurality of remote units comprises:
at least one optical-to-electrical (O-E) converter configured to convert the received optical downlink communications signal from the central unit over the at least one optical downlink communications medium to an electrical downlink communications signal and distribute the downlink communications signal comprising the electrical downlink communications signal to the client device.

* * * * *